(12) United States Patent  (10) Patent No.: US 8,809,827 B1
Annunziata  (45) Date of Patent: Aug. 19, 2014

(54) THERMALLY ASSISTED MRAM WITH MULTILAYER STRAP AND TOP CONTACT FOR LOW THERMAL CONDUCTIVITY

(71) Applicant: International Business Machines Corporation, Armonk, NY (US)

(72) Inventor: Anthony J. Annunziata, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/799,148

(22) Filed: Mar. 13, 2013

(51) Int. Cl.
  *H01L 29/02* (2006.01)
  *H01L 47/00* (2006.01)
  *H01L 27/22* (2006.01)
  *H01L 27/24* (2006.01)

(52) U.S. Cl.
  CPC .......... *H01L 27/222* (2013.01); *H01L 27/2463* (2013.01)
  USPC .......................................................... 257/2

(58) Field of Classification Search
  CPC ....... H01L 27/222; H01L 29/82; H01L 27/24; H01L 27/2463
  USPC ........ 257/295, E27.104, E29.272, E21.665, 2
  See application file for complete search history.

(56) References Cited

U.S. PATENT DOCUMENTS

| | | | |
|---|---|---|---|
| 5,005,102 A * | 4/1991 | Larson | 361/313 |
| 5,790,366 A * | 8/1998 | Desu et al. | 361/305 |
| 6,420,740 B1 * | 7/2002 | Zhang et al. | 257/295 |
| 6,759,250 B2 * | 7/2004 | Zhang et al. | 438/3 |
| 6,911,685 B2 | 6/2005 | Anthony et al. | |
| 7,038,263 B2 * | 5/2006 | Yang et al. | 257/295 |
| 7,126,201 B2 * | 10/2006 | Matsutera et al. | 257/421 |
| 7,270,848 B2 | 9/2007 | Suzuki et al. | |
| 7,397,074 B2 | 7/2008 | Nickel | |
| 7,714,315 B2 | 5/2010 | Happ et al. | |
| 7,855,435 B2 | 12/2010 | Klostermann et al. | |
| 8,094,421 B2 * | 1/2012 | Lin | 360/324.2 |
| 8,344,438 B2 * | 1/2013 | Schroeder et al. | 257/306 |
| 2004/0171272 A1 | 9/2004 | Jin et al. | |
| 2007/0158632 A1 | 7/2007 | Ho | |
| 2011/0147866 A1 * | 6/2011 | Sun et al. | 257/421 |
| 2012/0106245 A1 | 5/2012 | Mackay et al. | |
| 2014/0034891 A1 * | 2/2014 | Wang et al. | 257/2 |

OTHER PUBLICATIONS

S. Cardoso et al., "Double-barrier magnetic tunnel junctions with GeSbTe thermal barriers for improved thermally assisted magnetoreistive random access memory cells", Journal of Applied Physics, vol. 99, 2006, pp. 08N901-1 to 08N901-3.*

(Continued)

*Primary Examiner* — William D Coleman
(74) *Attorney, Agent, or Firm* — Cantor Colburn LLP; Vazken Alexanian

(57) ABSTRACT

A mechanism is provided for a thermally assisted magnetoresistive random access memory device (TAS-MRAM). The device includes a magnetic tunnel junction configured to store data, a first multilayer contact structure positioned on one end of the magnetic tunnel junction, and a second multilayer contact structure positioned on an opposite end of the magnetic tunnel junction. The first multilayer contact structure and the second multilayer contact structure each include multiple layers of metals. The multiple layers of metals are structured to inhibit thermal conductivity between the magnetic tunnel junction and surrounding structures, and the multiple layers of metals are structured to electrically conduct electrical current.

20 Claims, 6 Drawing Sheets

(56) References Cited

OTHER PUBLICATIONS

J. G. Deak et al., "Effect of Resistance-Area-Product and Thermal Environment on Writing of Magneto-Thermal MRAM," IEEE Transactions on Magnetics, vol. 42, Issue 10, Oct. 2006, pp. 2721-2723.

J. Wang et al., "Low-current blocking temperature writing of double barrier magnetic random access memory cells," Appl. Phys. Lett., vol. 84, 2004, pp. 945-947.

* cited by examiner

THERMALLY ASSISTED MRAM WITH MULTILAYER STRAP AND TOP CONTACT FOR LOW THERMAL CONDUCTIVITY

BACKGROUND

The present invention relates generally to magnetic memory devices, and more specifically, to thermally assisted MRAM devices that provide low thermal conductivity.

Magnetoresistive random access memory (MRAM) is a non-volatile computer memory (NVRAM) technology. Unlike conventional RAM chip technologies, MRAM data is not stored as electric charge or current flows, but by magnetic storage elements. The elements are formed from two ferromagnetic plates, each of which can hold a magnetic field, separated by a thin insulating layer. One of the two plates is a reference magnet set to a particular polarity; the other plate's field can be changed to match that of an external field to store memory and is termed the "free magnet" or "free-layer". This configuration is known as a magnetic tunnel junction and is the simplest structure for a MRAM bit. A memory device is built from a grid of such "cells." In some configurations of MRAM, such as the type further discussed herein, both the reference and free layers of the magnetic tunnel junctions can be switched using an external magnetic field.

SUMMARY

According to one embodiment, a thermally assisted magnetoresistive random access memory device (TAS-MRAM) is provided. The device includes a magnetic tunnel junction configured to store data, a first multilayer contact structure positioned on one end of the magnetic tunnel junction, and a second multilayer contact structure positioned on an opposite end of the magnetic tunnel junction. The first multilayer contact structure and the second multilayer contact structure each include multiple layers of metals. The multiple layers of metals are structured to inhibit thermal conductivity between the magnetic tunnel junction and surrounding structures, and the multiple layers of metals are structured to electrically conduct electrical current.

According to one embodiment, a thermally assisted magnetoresistive random access memory device (TAS-MRAM) is provided. The device includes a first magnetic tunnel junction configured to store data, a second magnetic tunnel junction configured to store data, and a first multilayer contact structure positioned on one end of the first magnetic tunnel junction. The device includes a second multilayer contact structure positioned on the first magnetic tunnel junction opposite the first multilayer contact structure, and a third multilayer contact structure positioned on one end of the second magnetic tunnel junction. The second multilayer contact structure is positioned on the second magnetic tunnel junction opposite the third multilayer contact structure. The first multilayer contact structure includes first multiple layers of metals, the second multilayer contact structure includes second multiple layers of metals, and the third multilayer contact structure include third multiple layers of metals. The first, second, and third multiple layers of metals are each structured to inhibit thermal conductivity and electrically conduct electrical current.

According to one embodiment, a thermally assisted magnetoresistive random access memory device (TAS-MRAM) is provided. The device includes a first magnetic tunnel junction configured to store data, a second magnetic tunnel junction configured to store data, a first multilayer contact structure positioned on one end of the first magnetic tunnel junction, a non-multilayer contact structure positioned on the first magnetic tunnel junction opposite the first multilayer contact structure, and a second multilayer contact structure positioned on one end of the second magnetic tunnel junction. The non-multilayer contact structure is positioned on the second magnetic tunnel junction opposite the second multilayer contact structure. The first multilayer contact structure includes first multiple layers of metals and the second multilayer contact structure includes second multiple layers of metals. The first multiple layers of metals and the second multiple layers of metals are each structured to inhibit thermal conductivity and electrically conduct electrical current.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Thermally-assisted magnetoresistive random access memory (TAS-MRAM) requires heating of the magnetic tunnel junction stack to a write temperature ($T_{write}$) higher than the operating temperature ($T_{op}$) in order to write the device. This is typically done by Joule heating from a bias current that is applied during the write process. The amount of power required to heat the device to $T_{write}$ is strongly dependent on the thermal conductivity between the device and the surrounding structures and substrate, which are at $T_{op} < T_{write}$. For typical devices and structures, the power required is undesirably large.

Figure 1:
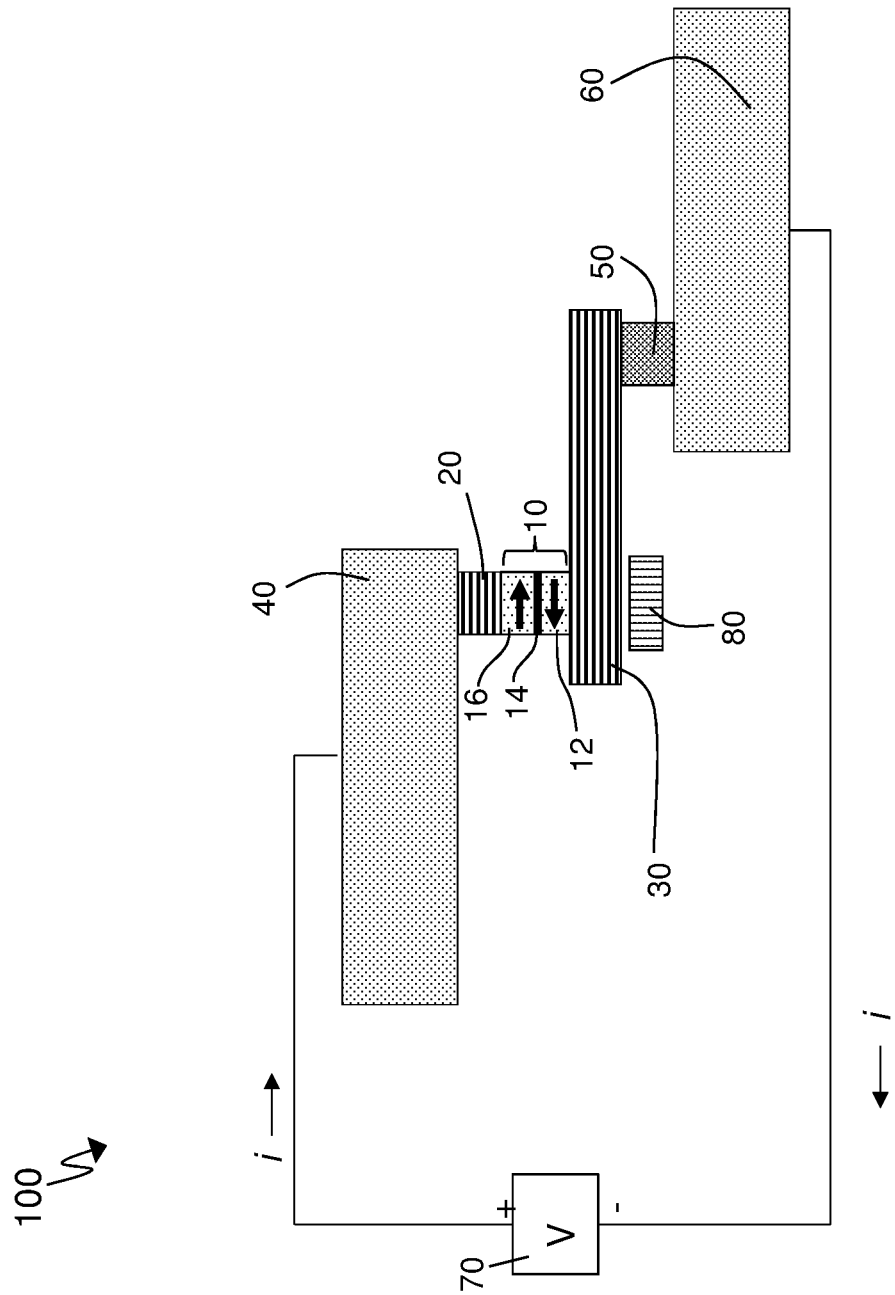
FIG. 1 is a cross-sectional view of a thermally-assisted magnetoresistive random access memory (TAS-MRAM) device according to an embodiment.

FIG. 1 illustrates a structure for a thermally-assisted magnetoresistive random access memory (TAS-MRAM) device 100 according to an embodiment.

The structure of the MRAM device 100 includes a magnetic tunnel junction (MTJ) 10. The magnetic tunnel junction 10 (including MTJ 10A and 10B discussed below) may include a ferromagnetic layer 12 with a non-magnetic tunnel barrier 14 disposed on the ferromagnetic layer 12. The magnetic tunnel junction 10 includes a sense ferromagnetic layer 16 disposed on top of the non-magnetic tunnel barrier 14. The stray fields from ferromagnetic layers 12 and 16 causes the ferromagnetic layer 12 and the sense ferromagnetic layer 16 to have opposite magnetic orientations (shown by opposite pointing arrows). The non-magnetic tunnel barrier 14 may be a semiconductor or insulator with a high resistance.

A multilayer thermally resistive contact structure 20 is disposed on the top magnetic tunnel junction 10 connecting the magnetic tunnel junction 10 (MRAM device 100) to a first wire 40. The magnetic tunnel junction 10 has a similar multilayer thermally resistive contact structure 30 disposed on the bottom, and the multilayer thermally resistive contact structure 30 connects the magnetic tunnel junction 10 (MRAM device 100) to a second wire 60, sometimes through via 50. Via 50 may be a metal connected to the second wire 60. The multilayer thermally resistive contact structures 20 and 30 may each be referred to as multilayer electrodes. Also, the multilayer thermally resistive contact structure 30 may be referred to as a metal strap. These multilayer thermally resistive contact structures 20 and 30 utilize a large boundary resistance for heat conduction across interfaces, but the relatively efficient electrical conduction across interfaces, to make an efficient heat barrier for the TAS-MRAM device 100.

Embodiments described herein reduce the power (e.g., voltage and/or current generated by a voltage and/or current source 70) required to heat the TAS-MRAM device 100 (which is analogous for TAS-MRAM devices 300 and 400) to $T_{write}$. Power to generate a write current (via the voltage source 70 to heat the MTJ 10 to the write temperature $T_{write}$) is reduced by reducing the thermal conductivity between the MTJ 10 and the surrounding strap (i.e., the multilayer thermally resistive contact structure 30) and contact structures (multilayer thermally resistive contact structure 20) at operating temperature $T_{op}$. Embodiments presented herein utilize interfacial thermal resistance (also referred to as boundary resistance or Kapitza resistance) in the top and bottom multilayer thermally resistive contact structures 20 and 30 of the TAS-MRAM device 100 to give small thermal conductivity between the MTJ 10 and the surrounding structures and substrate (such as a silicon wafer). Empirically and theoretically, thermal resistance is affected differently by interfaces than is electrical resistance (since charge transport by electrons is affected differently by lattice mismatch (i.e., by the multilayers of the contact structures 20 and 30), density-of-states mismatch, etc., than is thermal energy transport via electrons and phonons), enabling single or multiple-interface materials to have small thermal conductance but relatively large electrical conductance. In single/bulk materials, electrical and thermal conductivity are typically proportional to each other obeying, e.g., the Wiedemann-Franz law in metals.

The multilayer thermally resistive contact structure 20 significantly reduces the thermal conductivity (i.e., heat transfer) between the MTJ 10 and the wire 40, while allowing electricity to flow freely between the MTJ 10 and the wire 40. Similarly, the multilayer thermally resistive contact structure 30 significantly reduces the thermal conductivity (i.e., heat transfer) between the MTJ 10 and the wire 60, while allowing electricity to flow freely between the MTJ 10 and the wire 60.

Now, the write operation for the MRAM device 100 is discussed. The voltage source 70 produces a voltage and write bias current (i) flows into the wire 40, into the multilayer thermally resistive contact structure 20, through the MTJ 10, out through the multilayer thermally resistive contact structure 30, through the via 50 (e.g., metal connection), and out through the wire 60 (back to the voltage source 70). The MTJ 10 (particularly the tunnel barrier 14) has a high resistance compared to the other layers of the MRAM device 100, which causes the Joule heating at the MTJ 10. When the write temperature $T_{write}$ is reached, the heating has placed the ferromagnetic layer 12 in condition to have it magnetic orientation flipped or changed by a magnetic field applied by the magnetic field generating device 80. In other words, heating the MTJ 10 to the write temperature $T_{write}$ destabilizes the magnetic orientation of the ferromagnetic layer 12 so that the applied magnetic field can flip the magnetic orientation as desired. The magnetic generating device 80 may be a combination of an (insulated) metal wire connected to a voltage source to generate the magnetic field as understood by one skilled in the art.

In a conventional MRAM (without the multilayer thermally resistive contact structures 20 and 30 but having some other type of structures 20 and 30), when the write bias current flows through the MTJ 10, the heat generated at the MTJ 10 (e.g., particularly at the tunnel barrier 14) is lost because the heat (i.e., thermal energy) flows away from the MTJ 10 (i.e., flows out through the layer 20 and into layer 40 in one direction and flows away out through layer 30 and into layers 50 and 60 in the other direction if this were a convention MRAM). This would require the voltage source 70 to generate more power to compensate for the heat loss so that the MTJ 10 can reach the temperature $T_{write}$.

However, in the embodiments discussed herein, the multilayer thermally resistive contact structures 20 (20A and 20B) and 30 are designed and positioned in the MRAM device 100 to trap the heat in the MTJ 10 from above and below. Trapping the heat in the MTJ 10 is accomplished by the multilayer thermally resistive contact structure 20 (i.e., electrode) blocking heat from flowing out the MTJ 10 at the top and by the multilayer thermally resistive contact structure 30 (electrode) blocking heat from flowing out of the MTJ 10 at the bottom, all while allowing the write bias current to flow through the MRAM device 100.

For example, when the write bias current flows through the MTJ 10, the heat generated by the MTJ 10 (e.g., particularly at the tunnel barrier 14) is not lost because as the heat (i.e., thermal energy) tries to flow away above the MTJ 10 (i.e., tries to flow toward the layer 20 and into layer 40 in one direction) the multilayer thermally resistive contact structure 20 blocks the flow of heat (as the multilayer thermally resistive contact structure 20 is a thermal insulator to block the heat transfer (while allowing electrical current to flow)). Similarly, as the heat (i.e., thermal energy) tries to flow away below the MTJ 10 (i.e., tries to flow toward the layer 30, layer 50, and layer 60 in the bottom direction), the multilayer thermally resistive contact structure 30 blocks the flow of heat (as the multilayer thermally resistive contact structure 20 is a thermal insulator to block the heat transfer (while allowing electrical current to flow)). Accordingly, less heating is needed (because of the reduction in heat loss) which requires the voltage source 70 to generate less power (i.e., voltage) to reach the temperature $T_{write}$ for the MTJ 10.

Figure 2:
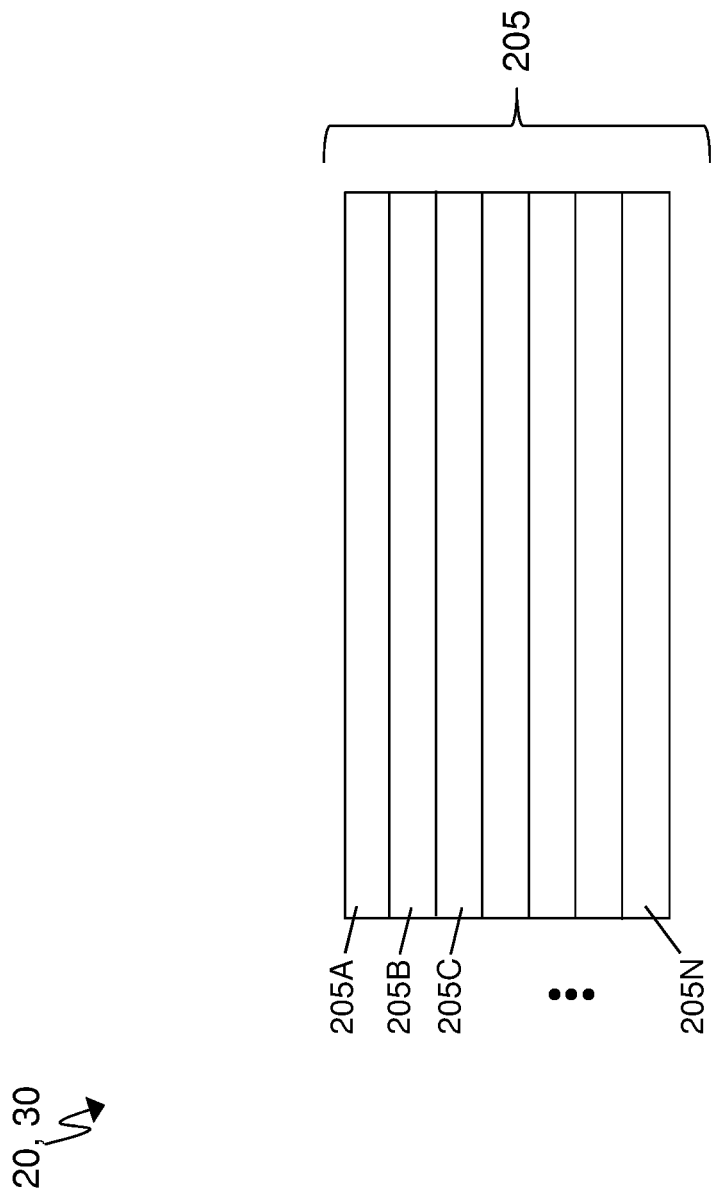
FIG. 2 is an example of the multilayer thermally resistive contact structures above and/or below the metal tunnel junction according to an embodiment.

FIG. 2 illustrates an example of the multilayer thermally resistive contact structures 20 (including 20A and 20B discussed below) and 30 according to an embodiment. The electrically conducting multilayer thermally resistive contact structure 20, 30 has multiple layers of metal (e.g., at least two or more) shown as different metal layers 205A through 205N, where N is the last metal layer. The metal layers 205A through 205N may generally be referred to as metal layers 205. In one case, each of the individual metal layers 205A through 205N of the multilayer thermally resistive contact structure 20, 30 may each be a different metal or metal alloy. Note metal layers 205 may be a metal (with standard impurities as understood by one skilled in the art), metal alloys, and combinations of both. Metals used in the metal layers 205 may include Ta, TaN, NiCr, NiCrN, and other resistive metals and their nitrides. These specific materials listed are useful because they provide a good base for the other magnetics layers to grow, and because their resistance is high enough to limit the non-interfacial contribution to thermal conductivity without being so high as to add significant series electrical resistance to the device.

In one case, the metal layers 205 may switch between two alternating metals/metal alloys, such as Ta and TaN. Also, the metal layers 205 may alternate among 3, 4, 5, 6, 7, etc., different metal layers 205, where the interface between each metal layer 205A through 205N is between two different metals/metal alloys (i.e., different conducting material). That is, no two of the same electrically conducting materials interface with one another (e.g., are disposed on one another) in the metal layer 205A through 205N. If metal layer 205A is gold, metal layer 205B interfacing (i.e., touching metal layer 205A) is not gold in one case. This same principle of not having the same electrically conducting materials interfacing one another occurs throughout the metal layer 205A through 205N.

As an example, the thickness of each metal layer 205 may be between 1 to 50 nm (nanometers) thick. The total thickness of the entire multilayer thermally resistive contact structure 20 or 30 (i.e., the combined thickness of all of the metal layers 205A through 205N) may be between 5 to 100 nm.

Further, the metal layers 205 should have a number of interfaces, e.g., two or more (with non-touching metal layers of the same material). An interface is where one metal layer 205 meets/contacts a different metal layer 205, such as between metal layers 205A and 205B, between metal layers 205B and 205C, and so forth. Each interface (of different materials) in the metal layers 205A through 205N works to inhibit the escape of heat in the multilayer thermally resistive contact structure 20, 30 by hindering/restricting the flow of phonons between the interfaces.

A phonon is a collective excitation in a periodic, elastic arrangement of atoms or molecules in condensed matter, such as solids and some liquids. Often referred to as a quasiparticle, the phonon represents an excited state in the quantum mechanical quantization of the modes of vibrations of elastic structures of interacting particles. A phonon is a quantum mechanical description of a special type of vibrational motion, in which a lattice uniformly oscillates at the same frequency, and the phonon has both wave-like and particle-like properties. Due to the connections between atoms in a material, the displacement of one or more atoms from their equilibrium positions will give rise to a set of vibration waves propagating through the lattice. The phonons carry heat through the lattice vibration. The lattice vibrations work better in a single material as oppose to the multilayers (the metal layers 205A through 205N) in the multilayer thermally resistive contact structure 20, 30. The multilayer property reduces thermal conductivity, and the interfaces (between the metal layers 205A through 205N) decrease the heat flow by increasing the thermal resistance.

The multiple interfaces between the multiple metal layers 205A through 205N block the flow of heat in the multilayer contact structure 20 (20A and 20B) and 30 by blocking a flow of phonons between the multiple interfaces. Embodiments are configured to decrease the heat loss and this reduction in heat may vary. For example, embodiments may have anywhere from 10-90% reduction in heat loss depending on the types of materials and number of interfaces used.

In one case, multilayer thermally resistive contact structure 20 (20A, 20B), 30 only includes electrically conducting materials as the multiple layers 205 of metals and metal alloys. The multilayer thermally resistive contact structures 20 (20A, 20B), 30 (and the multiple interfaces) are void of air vacuums as thermal insulators, is void of semiconductors as thermal insulators, is void of glass as thermal insulators, and is void of dielectrics as thermal insulators.

Figure 3:
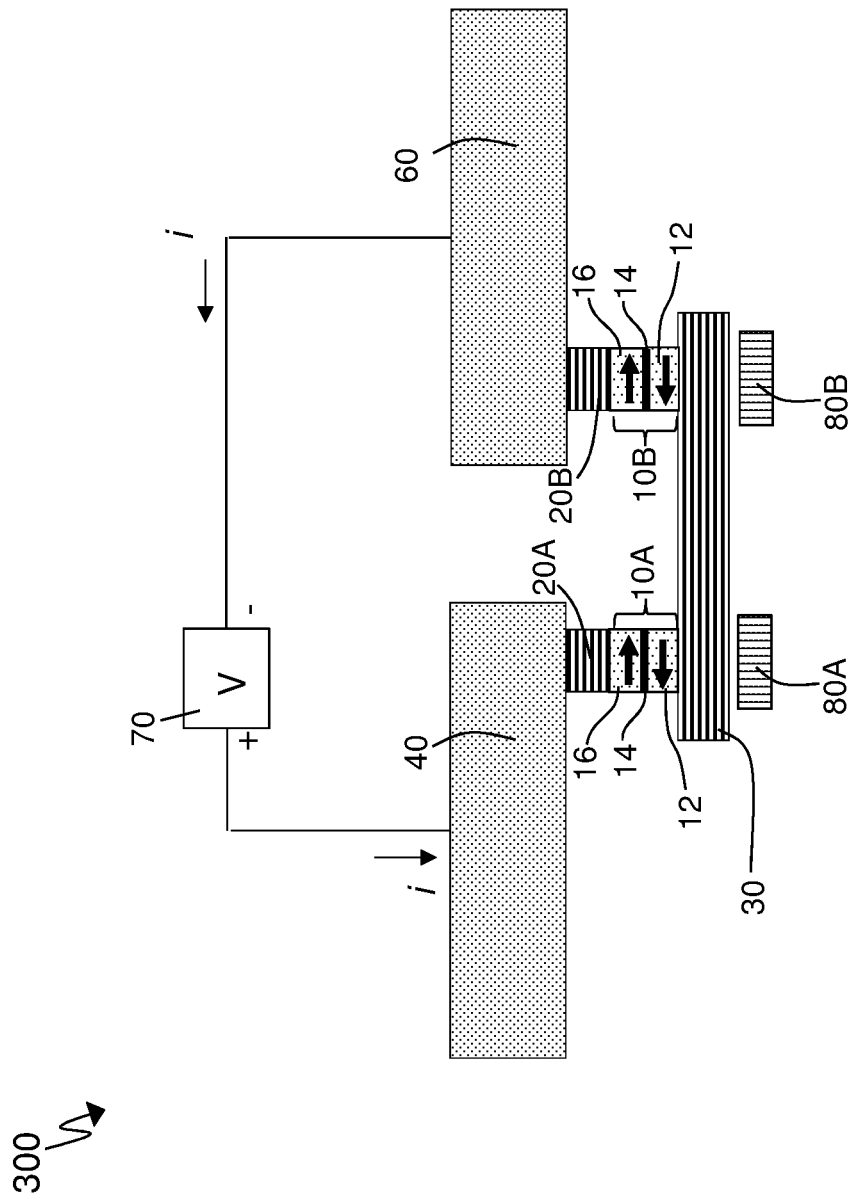
FIG. 3 is a cross-sectional view of a thermally-assisted magnetoresistive random access memory device according to another embodiment.

FIG. 3 illustrates a structure for a thermally-assisted magnetoresistive random access memory (TAS-MRAM) device 300 according to a second embodiment. Similar to the device 100 which includes the multilayer thermally resistive contact structures 20 and 30, the device 300 has two structures 20 designated as multilayer thermally resistive contact structures 20A and 20B in FIG. 3. Also, the device 300 has two magnetic tunnel junctions 10 (which operate as discussed above) designated as magnetic tunnel junctions 10A and 10B in FIG. 3.

In FIG. 3, the structure for the thermally-assisted magnetoresistive random access memory (TAS-MRAM) device 300 includes the magnetic tunnel junctions (MTJ) 10A, and the multilayer thermally resistive contact structure 20A is disposed on the top of the MTJ 10A. The multilayer thermally resistive contact structure 20A connects the first MTJ 10A to the contact wire 40. The thermally-assisted magnetoresistive random access memory (TAS-MRAM) device 300 includes the magnetic tunnel junctions (MTJ) 10B, and the multilayer thermally resistive contact structure 20B is disposed on the top of the MTJ 10B. The multilayer thermally resistive contact structure 20B connects the second MTJ 10B to the contact wire 60.

Both MTJs 10A and 10B are disposed (at opposite ends) on top of a multilayer thermally resistive contact (strap) structure 30. The multilayer thermally resistive (strap) structure 30 connects the two MTJs 10A and 10B to one another. These multilayer thermally resistive contact structures 20A, 20B, and 30 utilize the large boundary resistance for heat conduction across interfaces, but the relatively efficient electrical conduction across interfaces, to make an efficient heat barrier for the TAS-MRAM 300.

On the left side of the device 300, the multilayer thermally resistive contact structure 20A significantly reduces the thermal conductivity (i.e., heat transfer) between the MTJ 10A and the wire 40, while allowing electricity to flow freely between the MTJ 10A and the wire 40. Similarly, the multilayer thermally resistive contact structure 30 dramatically reduces the thermal conductivity (i.e., heat transfer) between the MTJ 10A and the MTJ 10B, while allowing electricity to flow freely between the MTJ 10A and the MTJ 10B.

On the right side of the device 300, the multilayer thermally resistive contact structure 20B significantly reduces the thermal conductivity (i.e., heat transfer) between the MTJ 10B and the wire 60, while allowing electricity to flow freely between the MTJ 10B and the wire 60. Similarly, the multilayer thermally resistive contact structure 30 dramatically reduces the thermal conductivity (i.e., heat transfer) between the MTJ 10B and the MTJ 10A, while allowing electricity to flow freely between the MTJ 10B and the MTJ 10A. This way, heating occurs in both MTJ 10A and MTJ 10B, but both MTJ 10A and 10B are able to retain their own heat.

Now, the write operation for the MRAM device 300 is discussed. The voltage source 70 produces a voltage, and write bias current (i) flows into the wire 40, into the multilayer thermally resistive contact structure 20A, through the MTJ 10A, out through the multilayer thermally resistive contact structure 30, into the MTJ 10B, out through the multilayer thermally resistive contact structure 20B, and out through the wire 60 (back to the voltage source 70). The MTJ 10A and 10B (particularly the tunnel barrier 14) have a high resistance compared to the other layers of the MRAM device 300, which causes the Joule heating at the MTJs 10A and 10B (as the current flows through the respective MTJs 10A and 10B). When the write temperature $T_{write}$ is reached, the heating has respectively placed the ferromagnetic layer 12 in condition to have it magnetic orientation flipped or changed by a magnetic field applied by the magnetic field generating device 80A and 80B. In other words, heating the MTJ 10A and 10B to the write temperature $T_{write}$ destabilizes their respective magnetic orientation of their respective ferromagnetic layer 12 so that the applied magnetic field can flip the magnetic orientation as desired. In FIG. 3, the multilayer thermally resistive contact structure 30 allows the MTJs 10A and 10B to share the electrical current (i) but blocks the MTJs 10A and 10B from sharing their respective heat. As such, heat is not loss in the length of the multilayer thermally resistive contact structure 30.

In FIG. 3, the multilayer thermally resistive contact structures 20A, 20B, and 30 are designed and positioned in the MRAM device 300 to respectively trap the heat in the MTJ 10A and 10B from above and below (as discussed herein). Accordingly, less heating is needed (because of the reduction in heat loss) which requires the voltage source 70 to generate less power (i.e., voltage) to reach the temperature $T_{write}$ for the MTJ 10.

Figure 4:
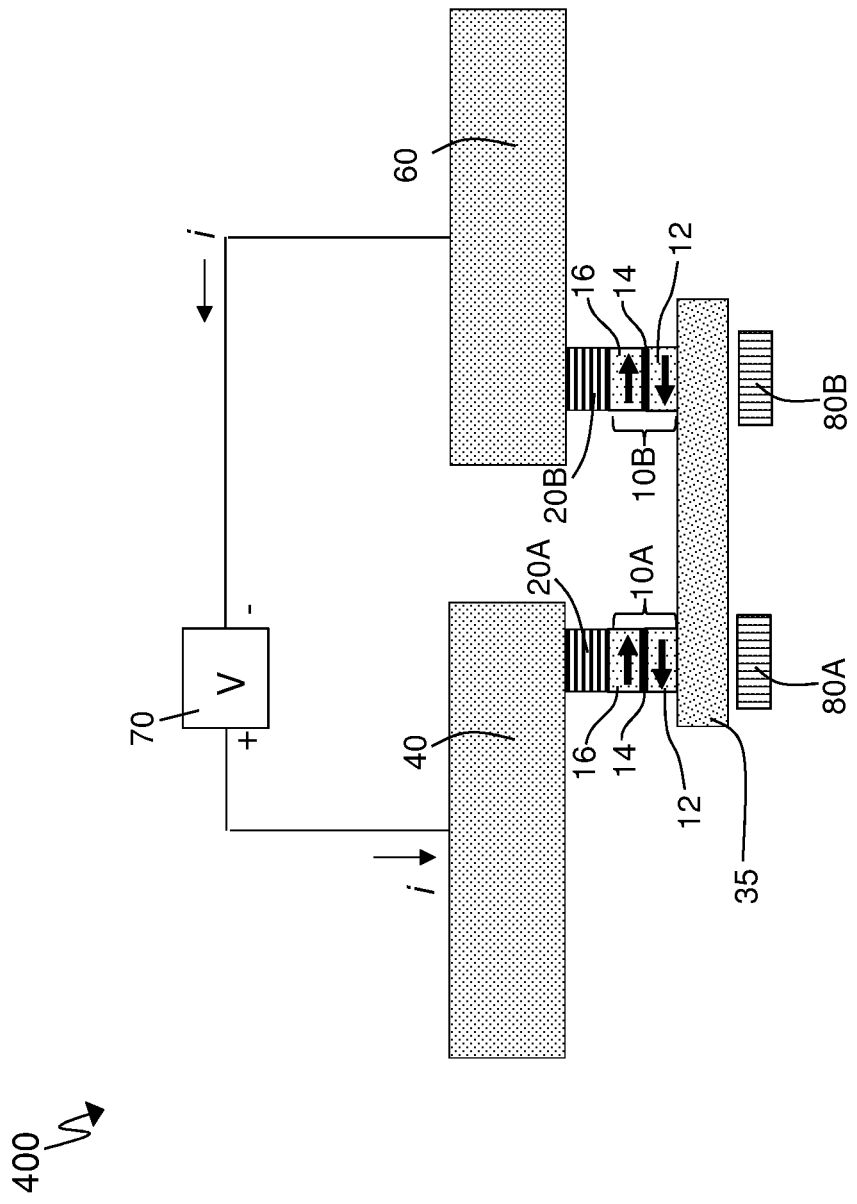
FIG. 4 is a cross-sectional view of a thermally-assisted magnetoresistive random access memory device according to an embodiment.

FIG. 4 illustrates a structure for a thermally-assisted magnetoresistive random access memory (TAS-MRAM) device 400 according to a third embodiment. Similar to the devices 100 and 400 which include the multilayer thermally resistive contact structures 20, the device 400 has two structures 20 designated as multilayer thermally resistive contact structures 20A and 20B in FIG. 4. Also, the device 400 has two magnetic tunnel junctions 10 (which operate as discussed above) designated as magnetic tunnel junctions 10A and 10B in FIG. 4. However, the thermally-assisted magnetoresistive random access memory device 400 does not include the multilayer thermally resistive contact structure 30. Instead, the device 400 has a standard non-thermally contact resistive strap 35 (i.e., a non-multilayer contact structure). The strap 35 may be metal (or a metal allow), such as gold, silver, etc., which does not decrease the flow of heat (as discussed).

In FIG. 4, the structure for the thermally-assisted magnetoresistive random access memory (TAS-MRAM) device 400 includes the magnetic tunnel junctions (MTJ) 10A, and the multilayer thermally resistive contact structure 20A is disposed on the top of the MTJ 10A. The multilayer thermally resistive contact structure 20A connects the first MTJ 10A to the contact wire 40. The thermally-assisted magnetoresistive random access memory (TAS-MRAM) device 400 includes the magnetic tunnel junctions (MTJ) 10B, and the multilayer thermally resistive contact structure 20B is disposed on the top of the MTJ 10B. The multilayer thermally resistive contact structure 20B connects the second MTJ 10B to the contact wire 60.

Both MTJs 10A and 10B are disposed (at opposite ends) on top of the non-thermally resistive contact strap 35, and the non-thermally resistive strap 35 connects the two MTJs 10A and 10B to one another. However, the non-thermally resistive strap 35 does not provide the large boundary resistance for heat conduction across interfaces (in contrast to the strap 30 in FIGS. 1 and 3), and accordingly, the two MTJs 10A and 10B share heat (i.e., thermal energy) and electrical current across the strap 35.

On the left side of the device 400, the multilayer thermally resistive contact structure 20A dramatically reduces the thermal conductivity (i.e., heat transfer) between the MTJ 10A and the wire 40, while allowing electricity to flow freely between the MTJ 10A and the wire 40.

On the right side of the device 400, the multilayer thermally resistive contact structure 20B dramatically reduces the thermal conductivity (i.e., heat transfer) between the MTJ 10B and the wire 60, while allowing electricity to flow freely between the MTJ 10B and the wire 60. The non-thermally resistive contact strap 35 does not reduce the thermal conductivity (i.e., heat transfer) between the MTJ 10B and the MTJ 10A. This way, heating occurs in both MTJ 10A and MTJ 10B, and both MTJ 10A and 10B share their heat with one another (which results from Joule heating).

Now, the write operation for the MRAM device 400 is discussed. The voltage source 70 produces a voltage, and write bias current (i) flows into the wire 40, into the multilayer thermally resistive contact structure 20A, through the MTJ 10A, out through the multilayer thermally resistive contact structure 30, into the MTJ 10B, out through the multilayer thermally resistive contact structure 20B, and out through the wire 60 (back to the voltage source 70). The MTJ 10A and 10B (particularly the tunnel barrier 14) have a high resistance compared to the other layers of the MRAM device 400, which causes the Joule heating at the MTJs 10A and 10B (as the current flows through the respective MTJs 10A and 10B). When the write temperature $T_{write}$ is reached, the heating has respectively placed the ferromagnetic layer 12 in condition to have its magnetic orientation flipped or changed by a magnetic field applied by the magnetic field generating device 80A and 80B. In other words, heating the MTJ 10A and 10B to the write temperature $T_{write}$ destabilizes their respective magnetic orientation of their respective ferromagnetic layer 12 so that the applied magnetic field can flip the magnetic orientation as desired. In FIG. 4, the non-thermally resistive contact strap 35 allows the MTJs 10A and 10B to share the electrical current (i) and heat. Since both MTJs 10A and 10B need and utilize the heat to destabilize their respective ferromagnetic layer 12 for changing the respective magnetic orientation, sharing the heat through strap 35 may aid in destabilizing the respective ferromagnetic layer 12 (especially if one of the MTJs 10A or 10B is not heating as efficiently).

Figure 5:
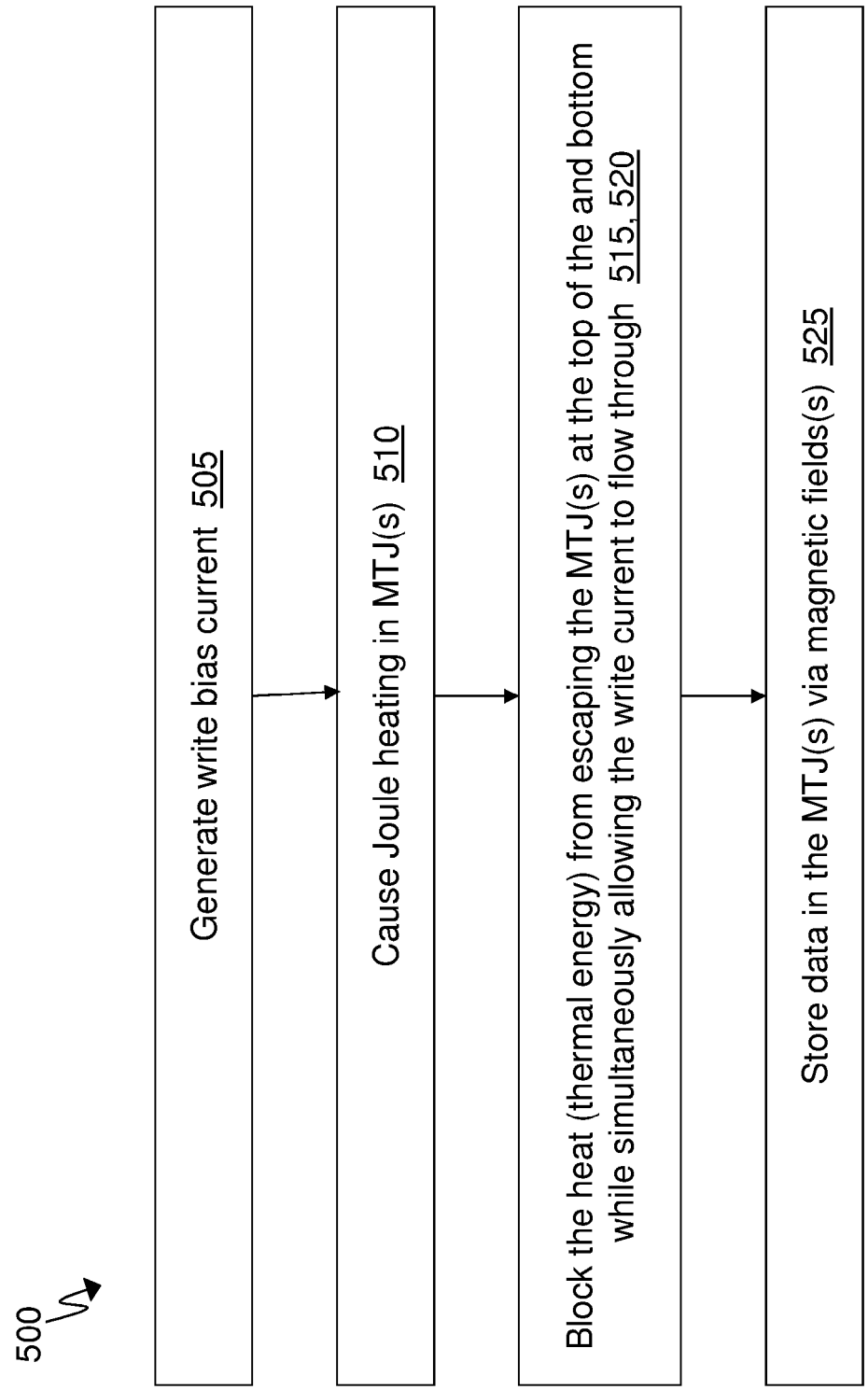
FIG. 5 illustrates a method of operation for the MRAM device(s) according to an embodiment.

FIG. 5 illustrates a method 500 of operation for the TAS-MRAM device 100, 300, 400 according to an embodiment.

Voltage is applied by the voltage source 70 to the contact wire 40 and the contact wire 60 to generate electrical write bias current (i) (which travels through the MRAM device 100, 300, 400 as discussed herein) at block 505. The write bias current flows through MTJ 10 (MTJ 10A and 10B) to cause Joule heating in the MTJ 10 at 510. At block 515, the multilayer thermally resistive contact structure 20 (structures 20A and 20B in FIGS. 3 and 4) blocks the heat (thermal energy) from escaping the MTJ 10 (MTJ 10A and 10B) at the top while simultaneously allowing the write current to flow through (structure 20), and the multilayer thermally resistive contact structure 30 (30A and 30B in FIG. 3) blocks the heat (thermal energy) from escaping the MTJ 10 (MTJ 10A and 10B) at the bottom while simultaneously allowing the write current to flow at block 520. In FIG. 4, the non-thermally resistive strap allows heat transfer between MTJs 10A and 10B along with the write current.

Data is stored in the MTJ 10 (MTJ 10A and 10B) by flipping the magnetic orientation of the ferromagnetic layer 12 as desired by the applied magnetic of from the magnetic field generating device 80 (device 80A and 80B in FIGS. 3 and 4) at block 525.

Figure 6:
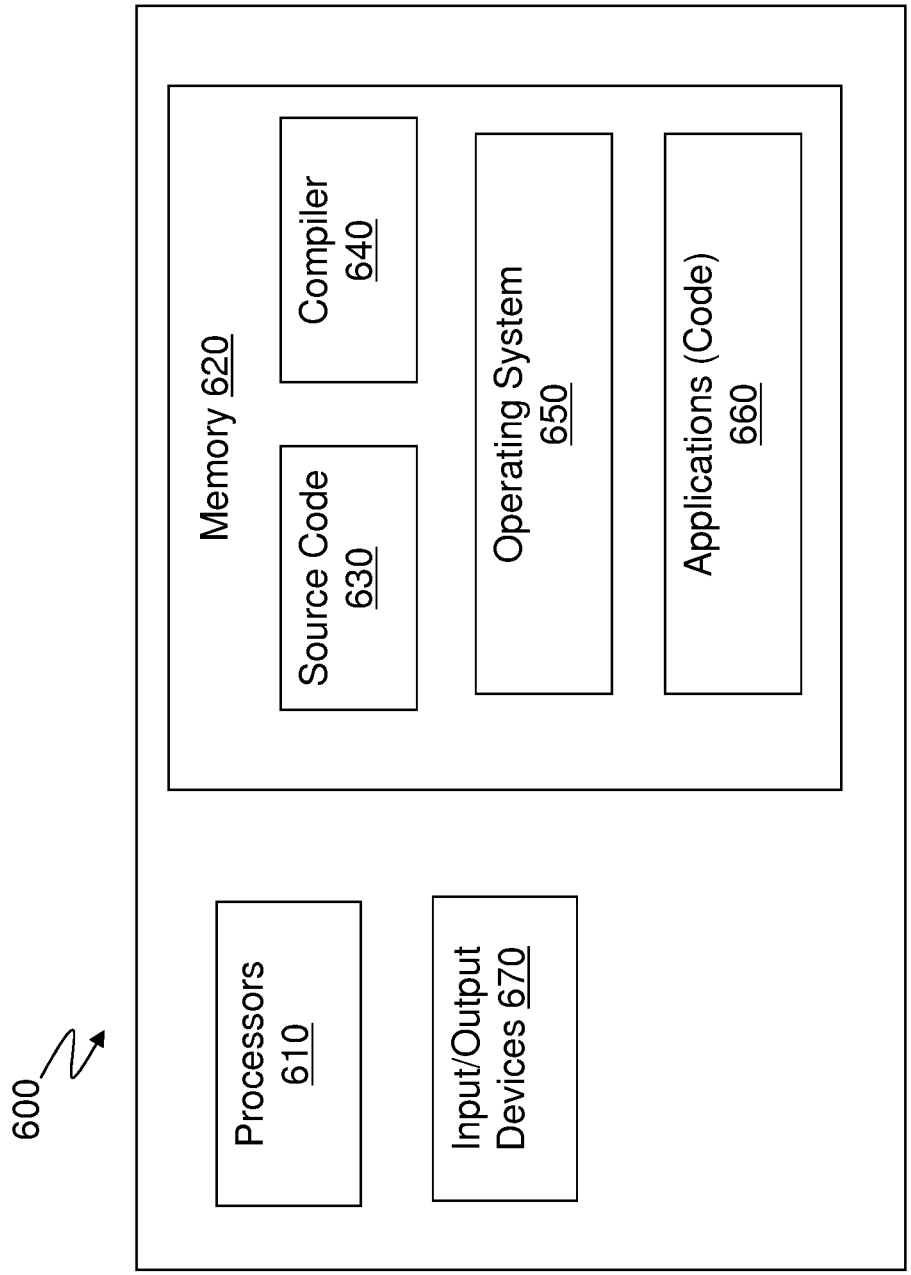
FIG. 6 illustrates an example of a computer which can be connected to, operate, and/or include the MRAM device(s) according to an embodiment.

FIG. 6 illustrates an example of a computer 600 (which may include the memory devices 100, 300, 400 having the thermal blocking features discussed herein) having capabilities, which may be included in exemplary embodiments. The MRAM device 100, 300, 400 be constructed in a memory array as understood by one skilled in the art (for reading and writing data), and the memory array may be part of the computer memory 620 discussed herein. Various methods, procedures, circuits, elements, and techniques discussed herein may also incorporate and/or utilize the capabilities of the computer 600. One or more of the capabilities of the computer 600 may be utilized to implement, to incorporate, to connect to, and/or to support any element discussed herein (as understood by one skilled in the art) in FIGS. 1-5.

Generally, in terms of hardware architecture, the computer 600 may include one or more processors 610, computer readable storage memory 620, and one or more input and/or output (I/O) devices 670 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 610 is a hardware device for executing software that can be stored in the memory 620. The processor 610 can be virtually any custom made or commercially available processor, a central processing unit (CPU), a data signal processor (DSP), or an auxiliary processor among several processors associated with the computer 600, and the processor 610 may be a semiconductor based microprocessor (in the form of a microchip) or a microprocessor.

The computer readable memory 620 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 620 may incorporate electronic, magnetic, optical, and/or other types of storage media. Note that the memory 620 can have a distributed architecture, where various components are situated remote from one another, but can be accessed by the processor 610.

The software in the computer readable memory 620 may include one or more separate programs, each of which comprises an ordered listing of executable instructions for implementing logical functions. The software in the memory 620 includes a suitable operating system (O/S) 650, compiler 640, source code 630, and one or more applications 660 of the exemplary embodiments. As illustrated, the application 660 comprises numerous functional components for implementing the features, processes, methods, functions, and operations of the exemplary embodiments. The application 660 of the computer 600 may represent numerous applications, agents, software components, modules, interfaces, controllers, etc., as discussed herein but the application 660 is not meant to be a limitation.

The operating system 650 may control the execution of other computer programs, and provides scheduling, input-output control, file and data management, memory management, and communication control and related services.

The application 660 may be a source program, executable program (object code), script, or any other entity comprising a set of instructions to be performed. When a source program, then the program is usually translated via a compiler (such as the compiler 640), assembler, interpreter, or the like, which may or may not be included within the memory 620, so as to operate properly in connection with the O/S 650. Furthermore, the application 660 can be written as (a) an object oriented programming language, which has classes of data and methods, or (b) a procedure programming language, which has routines, subroutines, and/or functions.

The I/O devices 670 may include input devices (or peripherals) such as, for example but not limited to, a mouse, keyboard, scanner, microphone, camera, etc. Furthermore, the I/O devices 670 may also include output devices (or peripherals), for example but not limited to, a printer, display, etc. Finally, the I/O devices 670 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 670 also include components for communicating over various networks, such as the Internet or an intranet. The I/O devices 670 may be connected to and/or communicate with the processor 610 utilizing Bluetooth connections and cables (via, e.g., Universal Serial Bus (USB) ports, serial ports, parallel ports, FireWire, HDMI (High-Definition Multimedia Interface), etc.).

When the computer 600 is in operation, the processor 610 is configured to execute software stored within the memory 620, to communicate data to and from the memory 620, and to generally control operations of the computer 600 pursuant to the software. The application 660 and the O/S 650 are read, in whole or in part, by the processor 610, perhaps buffered within the processor 610, and then executed.

When the application 660 is implemented in software it should be noted that the application 660 can be stored on virtually any computer readable storage medium for use by or in connection with any computer related system or method.

The application 660 can be embodied in any computer-readable medium for use by or in connection with an instruction execution system, apparatus, server, or device, such as a computer-based system, processor-containing system, or other system that can fetch the instructions from the instruction execution system, apparatus, or device and execute the instructions.

In exemplary embodiments, where the application 660 is implemented in hardware, the application 660 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A thermally assisted magnetoresistive random access memory device (TAS-MRAM), comprising:
   a magnetic tunnel junction configured to store data;
   a first multilayer contact structure positioned on one end of the magnetic tunnel junction; and
   a second multilayer contact structure positioned on an opposite end of the magnetic tunnel junction, such that the first multilayer contact structure and the second multilayer contact structure sandwich the magnetic tunnel junction in between;
   wherein the first multilayer contract structure is patterned with a width coextensive to a width of the magnetic tunnel junction;
   wherein the second multilayer contact structure is patterned with a width extended be and the width of the magnetic tunnel junction;
   wherein the first multilayer contact structure and the second multilayer contact structure each include multiple layers of metals, the multiple layers of metals structured to inhibit thermal conductivity between the magnetic tunnel junction and surrounding structures, and the multiple layers of metals structured to electrically conduct electrical current.

2. The device of claim 1, wherein the multiple layers of metals include multiple interfaces between the multiple layers of metals.

3. The device of claim 1, wherein when the electrical current is a write bias current applied to heat the magnetic tunnel junction, the first multilayer contact structure blocks the heat from escaping the magnetic tunnel junction at the one end.

4. The device of claim 1, wherein when the electrical current is a write bias current applied to heat the magnetic tunnel junction, the second multilayer contact structure blocks the heat from escaping the magnetic tunnel junction at the opposite end.

5. The device of claim 1, wherein the surrounding structures include a first wire and a second wire;
   wherein the first wire is positioned to the first multilayer contact structure and the second wire is positioned to the second multilayer contact structure; and
   wherein the first multilayer contact structure blocks heat from flowing to the first wire and the second multilayer contact structure blocks heat from flowing to the second wire.

6. The device of claim 1, wherein the first multilayer contact structure only includes electrically conducting materials as the multiple layers of metals;
   wherein the multiple layers of metals include metal alloys;
   wherein the first multilayer contact structure is void of air vacuums as thermal insulators, is void of semiconductors as thermal insulators, is void of glass as thermal insulators, and is void of dielectrics as thermal insulators; and
   wherein the first multilayer contact structure excludes insertions of the air vacuums, the semiconductors, the glass, and the dielectrics at interfaces between the multiple layers of metals.

7. The device of claim 1, wherein the second multilayer contact structure only includes electrically conducting materials as the multiple layers of metals;
   wherein the multiple layers of metals include metal alloys;
   wherein the second multilayer contact structure is void of air vacuums as thermal insulators, is void of semiconductors as thermal insulators, is void of glass as thermal insulators, and is void of dielectrics as thermal insulators; and
   wherein the second multilayer contact structure excludes insertions of the air vacuums, the semiconductors, the glass, and the dielectrics at interfaces between the multiple layers of metals.

8. The device of claim 2, wherein the multiple layers of metals conduct the electrical current through the multiple interfaces when voltage is applied.

9. The device of claim 2, wherein the multiple interfaces between the multiple layers of metal block a flow of heat in the first multilayer contact structure by blocking a flow of phonons between the multiple interfaces.

10. The device of claim 2, wherein the multiple interfaces between the multiple layers of metal block a flow of heat in the second multilayer contact structure by blocking a flow of phonons between the multiple interfaces.

11. A thermally assisted magnetoresistive random access memory device (TAS-MRAM), comprising:
    a first magnetic tunnel junction configured to store data;
    a second magnetic tunnel junction configured to store data;
    a first multilayer contact structure positioned on one end of the first magnetic tunnel junction;
    a second multilayer contact structure positioned on the first magnetic tunnel junction opposite the first multilayer contact structure, such that the first multilayer contact structure and the second multilayer contact structure sandwich the first magnetic tunnel junction in between; and
    a third multilayer contact structure positioned on one end of the second magnetic tunnel junction, the second multilayer contact structure being positioned on the second magnetic tunnel junction opposite the third multilayer contact structure, such that the second multilayer contact structure and the third multilayer contact structure sandwich the second magnetic tunnel junction in between;
    wherein the first magnetic tunnel junction and the second magnetic tunnel junction are each disposed on a same side of the second multilayer contact structure;
    wherein the first multilayer contact structure includes first multiple layers of metals, the second multilayer contact structure includes second multiple layers of metals, and the third multilayer contact structure include third multiple layers of metals; and
    wherein the first, second, and third multiple layers of metals are each structured to inhibit thermal conductivity and electrically conduct electrical current.

12. The device of claim 11, wherein the first multiple layers of metals inhibit thermal conductivity between the first magnetic tunnel junction and a first wire.

13. The device of claim 11, wherein the second multiple layers of metals inhibit thermal conductivity between the first magnetic tunnel junction and the second magnetic tunnel junction while allowing the electrical current.

14. The device of claim 11, wherein the first multiple layers of metals include first multiple interfaces in between the first multiple layers of metals;
wherein the second multiple layers of metals include second multiple interfaces in between the second multiple layers of metals; and
wherein the third multiple layers of metals include third multiple interfaces in between the third multiple layers of metals.

15. The device of claim 12, wherein the third multiple layers of metals inhibit thermal conductivity between the second magnetic tunnel junction and a second wire.

16. The device of claim 12, wherein the second multiple layers of metals inhibit thermal conductivity between the second magnetic tunnel junction and a second wire.

17. The device of claim 14, wherein the first multiple layers of metals conduct the electrical current through the first multiple interfaces when voltage is applied;
wherein the second multiple layers of metals conduct the electrical current through the second multiple interfaces when the voltage is applied; and
wherein the third multiple layers of metals conduct the electrical current through the third multiple interfaces when the voltage is applied.

18. The device of claim 17, wherein the first multiple interfaces between the first multiple layers of metal block a flow of heat in the first multilayer contact structure by blocking a flow of phonons between the first multiple interfaces;
wherein the second multiple interfaces between the second multiple layers of metal block a flow of heat in the second multilayer contact structure by blocking a flow of phonons between the second multiple interfaces; and
wherein the third multiple interfaces between the third multiple layers of metal block a flow of heat in the third multilayer contact structure by blocking a flow of phonons between the third multiple interfaces.

19. A thermally assisted magnetoresistive random access memory device (TAS-MRAM), comprising:
a first magnetic tunnel junction configured to store data;
a second magnetic tunnel junction configured to store data;
a first multilayer contact structure positioned on one end of the first magnetic tunnel junction;
a non-multilayer contact structure positioned on the first magnetic tunnel junction opposite the first multilayer contact structure, such that the first multilayer contact structure and the non-multilayer contact structure sandwich the first magnetic tunnel junction in between; and
a second multilayer contact structure positioned on one end of the second magnetic tunnel junction, the non-multilayer contact structure being positioned on the second magnetic tunnel junction opposite the second multilayer contact structure, such that the non-multilayer contact structure and the second multilayer contact structure sandwich the second magnetic tunnel junction in between;
wherein the first magnetic tunnel junction and the second magnetic tunnel junction are each disposed on a same side of the non-multilayer contact structure;
wherein the first multilayer contact structure includes first multiple layers of metals and the second multilayer contact structure includes second multiple layers of metals; and
wherein the first multiple layers of metals and the second multiple layers of metals are each structured to inhibit thermal conductivity and electrically conduct electrical current.

20. The device of claim 19, wherein the first multiple layers of metals inhibit thermal conductivity between the first magnetic tunnel junction and a first wire.

* * * * *